United States Patent
Menke (10) Patent No.: US 7,463,074 B2
(45) Date of Patent: Dec. 9, 2008

(54) INTEGRATED CIRCUIT AND METHOD FOR GENERATING A READY SIGNAL

(75) Inventor: Manfred Menke, Wolfratshausen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/032,536

(22) Filed: Jan. 10, 2005

(65) Prior Publication Data

US 2005/0179477 A1    Aug. 18, 2005

(30) Foreign Application Priority Data

Jan. 10, 2004    (DE) .................... 10 2004 001 578

(51) Int. Cl.
*H03L 7/00* (2006.01)

(52) U.S. Cl. ...................... 327/142; 327/143

(58) Field of Classification Search ............... 327/143, 327/142

See application file for complete search history.

(56) References Cited

U.S. PATENT DOCUMENTS

| | | | |
|---|---|---|---|
| 5,612,641 A * | 3/1997 | Sali | 327/143 |
| 6,084,388 A | 7/2000 | Toosky | |
| 6,377,090 B1 | 4/2002 | Bruno | |
| 6,469,552 B2 * | 10/2002 | Ohbayashi et al. | 327/143 |
| 6,525,515 B1 | 2/2003 | Ngo et al. | |
| 6,590,444 B2 * | 7/2003 | Ikehashi et al. | 327/541 |
| 6,683,481 B1 * | 1/2004 | Zhou et al. | 327/143 |
| 6,731,143 B2 * | 5/2004 | Kim | 327/143 |
| 6,774,882 B2 * | 8/2004 | Yamazaki et al. | 345/98 |
| 2001/0010480 A1 | 8/2001 | Kato et al. | |
| 2004/0217785 A1 * | 11/2004 | Colbeck et al. | 327/142 |

OTHER PUBLICATIONS

German Patent Office Examination Report dated Nov. 25, 2004.

* cited by examiner

*Primary Examiner*—Kenneth B. Wells
*Assistant Examiner*—Ryan C Jager
(74) *Attorney, Agent, or Firm*—Patterson & Sheridan, L.L.P.

(57) ABSTRACT

An integrated circuit comprises an input for receiving a supply voltage, a field-effect transistor with a gate which is connected to the input in such a manner that the gate voltage present at the gate is a function of the supply voltage, a voltage source for generating a reference voltage which is connected to the input for receiving the supply voltage, a device for determining whether the gate voltage of the field effect transistor exceeds a turn-on voltage of the field-effect transistor, and a device for generating a ready signal which indicates that the supply voltage is high enough for performing functions of the integrated circuit, the device for generating being constructed for generating the ready signal when the gate voltage of the field-effect transistor exceeds the turn-on voltage of the field-effect transistor. The integrated circuit is characterized by the fact that a device for detecting the reference voltage generated by the voltage source is provided and the device for generating the ready signal is also constructed for generating the ready signal only when the reference voltage lies within a predetermined interval.

6 Claims, 3 Drawing Sheets

INTEGRATED CIRCUIT AND METHOD FOR GENERATING A READY SIGNAL

CROSS-REFERENCE TO RELATED APPLICATIONS

This application claims foreign priority benefits under 35 U.S.C. §119 to co-pending German patent application number DE 10 2004 001 578.3-33, filed 10 Jan. 2004. This related patent application is herein incorporated by reference in its entirety.

BACKGROUND OF THE INVENTION

1. Field of the Invention

The present invention relates to an integrated circuit and to a method for generating a ready signal which, after a power supply of an integrated circuit has been connected, indicates that the supply voltage is high enough for performing functions of the integrated circuit faultlessly.

2. Description of the Related Art

Nowadays, a circuit for detecting the adequate supply voltage is built into almost every complex chip or almost every complex integrated circuit, respectively. In particular, an appropriate logic ensures that when a power supply for the integrated circuit is switched on, after a certain level of the supply voltage is reached, an internal reset signal or an initialization signal is generated for a certain period of time which effects a resetting or initialization of the entire digital logic or also analog circuit. In this arrangement, the supply voltage is usually detected by a detection circuit which makes use of the turn-on voltage of an n- or p-channel transistor. When the turn-on voltage is reached, the reset or initialization signal is activated for a certain period of time and then deactivated again. The reset or initialization signal is generally referred to herein as the ready signal in the text which follows.

In a conventional integrated circuit, it is possible, when the supply voltage rises very slowly, that the ready signal is generated at a time at which the supply voltage is not yet high enough for the integrated circuit to be correctly reset or initialized. Furthermore, it is possible, when the supply voltage rises very slowly, that after the resetting or initialization, the supply voltage is not yet high enough for keeping all analog circuit blocks or part-circuits of the integrated circuit in a settled state. For example, part-circuits which need voltage generators or obtain input voltages from these can then start at a supply voltage which is too low. In this case, it is not ensured that the resetting or initialization, also called power-on sequence in the text which follows, proceeds correctly. For example, at a node which is provided for being supplied with a negative voltage by a voltage generator, a positive voltage can form for a short time. In general, unwanted states can occur which cast doubt on a correct resetting or a correct initialization, and thus on a correct operation overall.

Another disadvantage of conventional circuits is that power-on detection circuits in some cases need high currents which are not compatible with a low-power design or a design for low-power consumption, respectively.

Thus, there is a need for an improved integrated circuit or an improved method for generating a ready signal which indicates that the supply voltage of an integrated circuit is high enough.

SUMMARY OF THE INVENTION

According to one embodiment of the present invention, an integrated circuit comprises a device for detecting the reference voltage generated by a voltage source and a device for generating a ready signal, which is constructed for generating the ready signal only when a voltage, which is dependent on the supply voltage, exceeds a minimum voltage for switching a switch, and the reference voltage is within a predetermined interval.

Furthermore, another embodiment of the present invention provides a method for generating a ready signal which, after a power supply of an integrated circuit has been connected, indicates that the supply voltage is high enough for performing functions of the integrated circuit faultlessly. The ready signal is generated when a voltage, which is dependent on the supply voltage, exceeds a minimum voltage at which a switch (24; 62, 64) switches and the reference voltage is within a predetermined interval.

Embodiments of the present invention are based on the concept of making the generation of a ready signal after the connection of a power supply for an integrated circuit dependent not only on the exceeding of a turn-on voltage of a field-effect transistor but, in addition, also on the presence of a reference voltage or, in particular, on whether the reference voltage lies within a predetermined interval.

An advantage of the present invention is that the generation of a ready signal is dependent on a condition which, at the same time, is a condition for the correct functioning of many part-circuits of integrated circuits. The integrated circuit is thus reset or initialized when an essential condition for the correct functioning of the part-circuits, and thus also for the correct process of resetting or initialization, is given. Examples of part-circuits, the operation of which depend on the presence of a reference voltage, are voltage generators whose output voltages, as a rule, are referred to a reference voltage. Embodiments of the present invention ensure that the build-up of output voltages of voltage generators is concluded at the time when the resetting or initialization is cancelled, independently of the rate of increase of the supply voltage.

A further advantage of the present invention is that the devices may be implemented without voltage dividers, as a result of which shunt currents are largely avoided and low-power requirements can be met more easily. Furthermore, exemplary embodiments described in the text which follows are designed in such a manner that the generation of the ready signal is independent of parasitic effects. Furthermore, internal nodes are discharged in a defined manner after the power supply has been switched off so that the same starting conditions exist in a next connecting sequence. A further important advantage of the present invention is that its operation can be implemented independently of absolute values of components, the operation only depending on the relationships between the values of the components.

BRIEF DESCRIPTION OF THE DRAWINGS

In the text which follows, preferred exemplary embodiments of the present invention are explained in greater detail with reference to the attached figures, in which.

DETAILED DESCRIPTION OF THE PREFERRED EMBODIMENT

Figure 1:
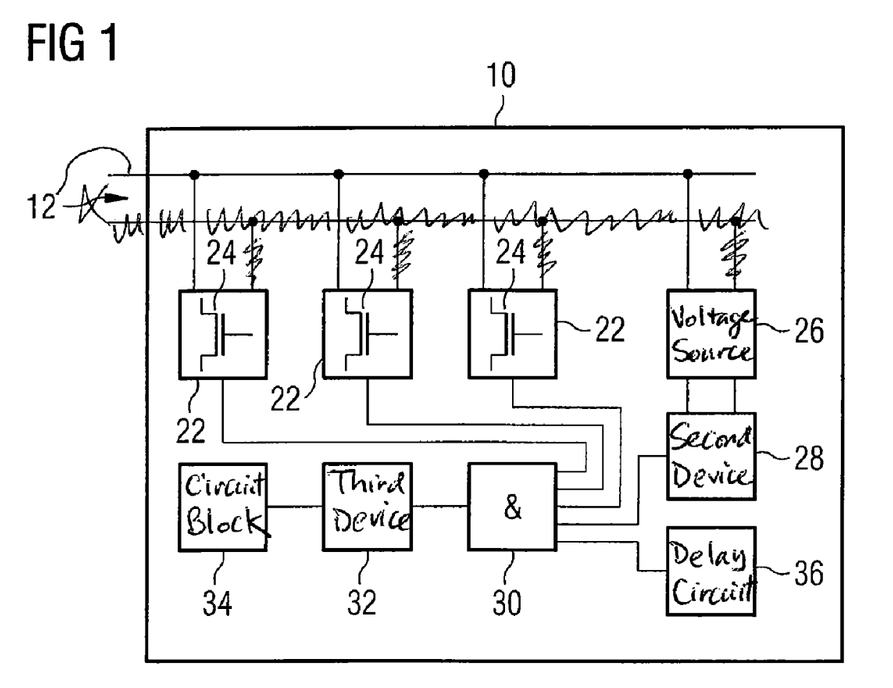
FIG. 1 shows a diagrammatic representation of an integrated circuit according to one embodiment of the present invention.

FIG. 1 is a diagrammatic representation of an integrated circuit 10 according to an exemplary embodiment of the present invention. The integrated circuit 10 is, for example, a memory circuit or, in particular, a DRAM memory circuit. The integrated circuit 10 comprises an input 12 for receiving a supply voltage for supplying the integrated circuit 10 with power. Furthermore, the integrated circuit 10 comprises a plurality (in the present case, three) of first devices 22 with, in each case, one field-effect transistor (FET) 24. Each FET 24 includes a gate which is connected to the input 12 so that the gate voltage which is present at the gate is a function of the supply voltage. Each of the first devices 22 is constructed for determining whether the gate voltage of the repectively associated FET 24 exceeds its turn-on voltage. This determination is equivalent to measuring the channel resistance which clearly changes when the turn-on voltage is exceeded. For example, the turn-on voltage being exceeded can be detected from a change in the channel current. Each first device 22 generates a signal which indicates whether the gate voltage in the associated FET 24 exceeds the turn-on voltage.

Furthermore, the integrated circuit 10 includes a voltage source 26 which is connected to the input 12 to receive the supply voltage and electrical power. The voltage source 26 generates a reference voltage when the supply voltage is high enough. When the supply voltage is too low, the voltage source 26 generates, for example, a voltage which essentially corresponds to the supply voltage. It is only above a minimum level of the supply voltage that the voltage source 26 generates the reference voltage which is then relatively independent of the supply voltage and differs from the latter. The reference voltage is needed and used by one or more further components of the integrated circuit 10.

The integrated circuit 10 further comprises a second device 28 for detecting the reference voltage generated by the voltage source 26.

An AND gate 30 generates a ready signal from a logical AND combination of signals which are generated by the first devices 22 and the second device 28. The signals which are generated by the first devices 22 and the second device 28 indicate whether the gate voltage of the respective FET 24 exceeds the respective turn-on voltage and, respectively, the reference voltage generated by the voltage source 26 lies within a predetermined interval.

The ready signal generated by the AND gate 30 controls a third device 32 for resetting or initializing the integrated circuit 10 or in one or more parts of the integrated circuit 10 which are symbolically represented by a circuit block 34 in FIG. 1.

As a rule, integrated circuits have a number of different designs of transistors which differ in their type, in the length and width of their channels and other parameters. Each of these designs generally requires a different turn-on voltage which, in addition, depends in different ways on process parameters during the production which can vary from batch to batch and from wafer to wafer. It is, therefore, frequently not known which transistor design has the highest turn-on voltage but is dependent on random fluctuations of process parameters during the production of the integrated circuit.

In order to ensure, nevertheless, that the ready signal is only generated when the turn-on voltages of all transistors have been reached, the integrated circuit shown in FIG. 1, according to one embodiment of the invention, provides a plurality of field-effect transistors 24 in a plurality of first devices 22. Among all transistor designs which are provided in the integrated circuit 10, those with the highest turn-on voltages are represented by respective one of the field-effect transistors 24. For particular values of the process parameters (which are random within the fluctuations), any one of the field effect transistors 24 in the first devices 22 may have the highest turn-on voltage. Since the signals of all first devices 22 are logically AND combined (e.g., via AND gate 30), it is ensured that the ready signal is only generated when the gate voltage for each transistor design, and thus for each individual transistor of the integrated circuit 10, exceeds its respective turn-on voltage.

If the described influence of fluctuations of the process parameters during the production of the integrated circuit 10 on the turn-on voltage of the various field-effect transistors of the integrated circuit 10 is negligible and, in particular, if it is known, independently of possible fluctuations, which transistor has the highest turn-on voltage, only one first device 22 with a FET 24 of the design which has the highest turn-on voltage is provided, in deviation from the exemplary embodiment shown in FIG. 1.

The result is thus that at the time of generation of the ready signal, all transistors of the integrated circuit 10 will reliably switch since their switching sources or turn-on voltages have been reached in every case.

According to a further variant, the integrated circuit is also supplemented by a delay circuit 36, the output signal of which is also logically AND combined with the other signals by the AND gate 30. This additional interrogation of the delay circuit 36 ensures even with a very fast rise in the supply voltage that the conditions for correct operation of the integrated circuit are given, particularly the reference voltage present and the turn-on voltage of each field-effect transistor has been reached independently of impedances in the power feed.

As an alternative to the exemplary embodiment shown above with reference to FIG. 1, the delay circuit may be arranged between the AND gate 30 and the third device 32 and delays the ready signal formed by the AND gate.

As an alternative, the operation of the first devices 22 of the second device 28 and of the AND gate 30 may also be implemented in a different grouping and particularly also in an integrated device in which the described operations of the first devices 22 and of the second device 28 of the exemplary embodiment from FIG. 1 are present.

Figure 4:
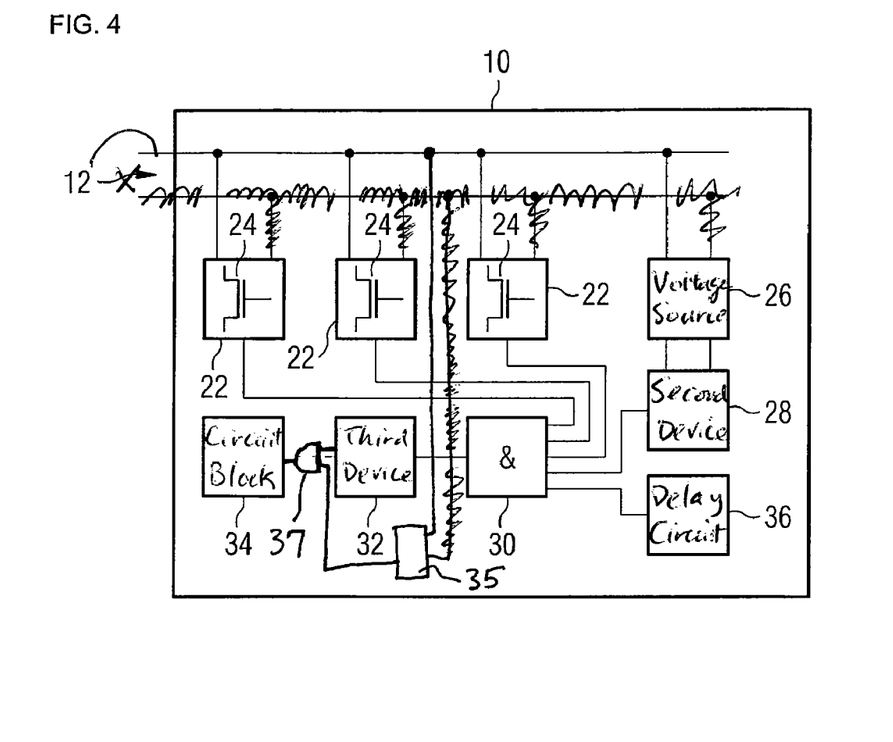
FIG. 4 illustrates another embodiment of the integrated circuit.

FIG. 4 illustrates one embodiment of the integrated circuit wherein the third device is configured to generate the ready signal in the case of a slow rise of the supply potential only when the supply voltage is high enough. The integrated circuit further comprises a fifth device 35 for generating a second ready signal, the fifth device configured to generate the second ready signal in the case of a fast rise of the supply voltage only when the supply voltage is high enough, and an AND gate 37 configured to generate a third ready signal by logically combining the ready signal and the second ready signal.

Figure 2:
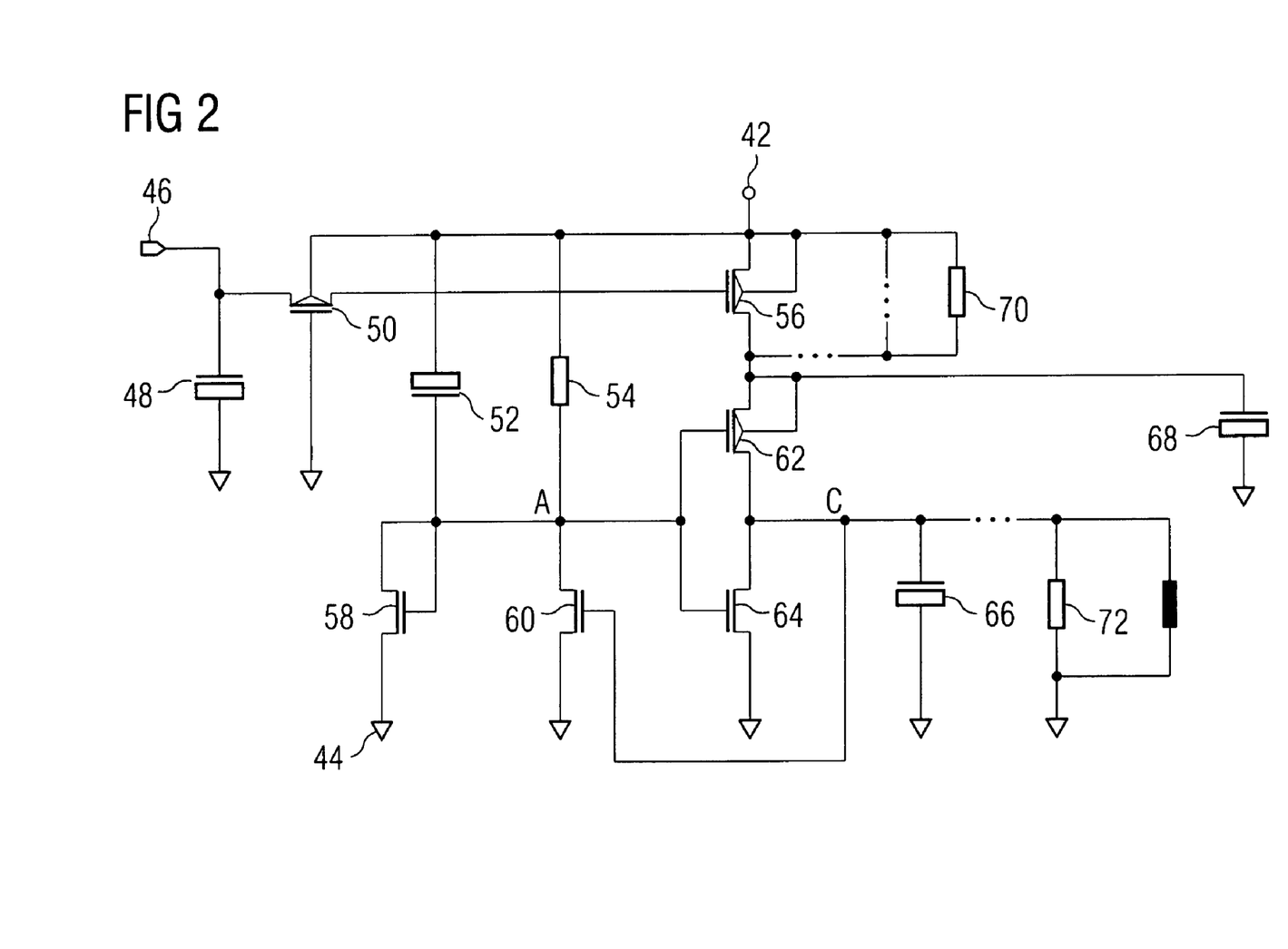
FIG. 2 shows a circuit diagram which represents a part of an integrated circuit according to one exemplary embodiment of the present invention.

FIG. 2 shows a circuit diagram of an alternative exemplary embodiment of the present invention.

Figure 3:
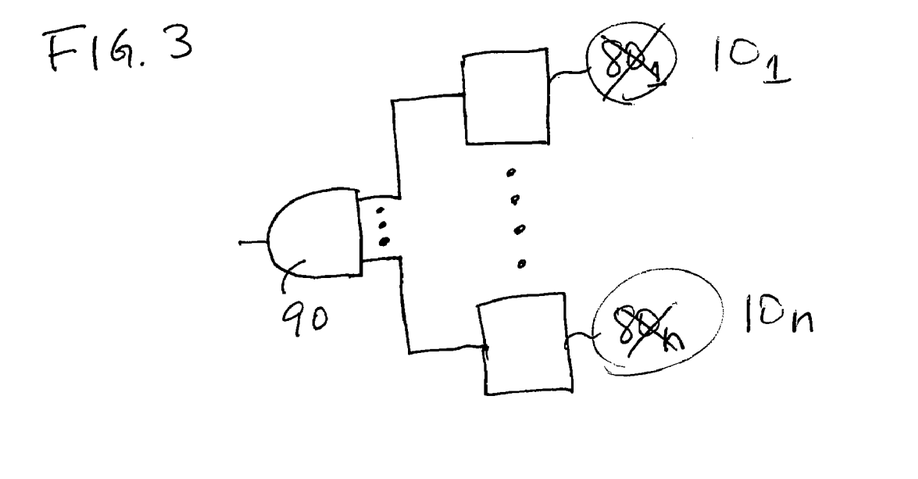
FIG. 3 illustrates another embodiment of the integrated circuit.

The circuit shown by means of FIG. 2 in the text which follows may be present once or several times in the integrated circuit. A number of circuits with different field-effect transistors, the output signals of which are logically AND combined to end resetting or to generate a ready signal triggering an initialization, ensure that even in the case of fluctuating process parameters during the production of the integrated circuit, the ready signal is only generated when the turn-on voltages of all field-effect transistors of the integrated circuit have been reached. FIG. 3 illustrates one embodiment having such features, including a plurality of circuits $10_1$ to $10_n$ (each representative of an instance of the circuit 10 of FIG. 1) and an AND gate 90.

A number of the circuits shown in FIG. 2 and in the text which follows, with different time characteristics, the output signals of which are logically AND combined to generate the ready signal, can ensure that the ready signal is generated independently of the rate of increase of the supply voltage and only when a full operability of the integrated circuit or at least a faultless resetting or initialization of the latter is guaranteed. In this arrangement, the circuit may exist in two different variants and is constructed in such a manner, on the one hand, that it does not generate the ready signal too early with a rapid rise in the supply voltage and, on the other hand, that it does not generate the ready signal too early with a slow rise in the supply voltage.

The circuit shown in FIG. 2 comprises a first connection 42 to which a supply voltage VSP with respect to ground 44 is to be applied, and a second connection 46 to which a reference voltage $V_{ref}$ with respect to ground 44 is to be applied. The first connection 42 and a ground connection form one input for receiving the supply voltage. The second connection 46 and the ground connection form one input for receiving the reference voltage. Between the second connection 46 and ground 44, a first capacitor 48 is arranged. The first connection 42 is connected to a substrate contact of a first p-channel FET, the gate of which is connected to ground 44. The first connection 42 is also connected via a second capacitor 52 and a parallel-connected first resistor 54 to a node A. The channel of a second p-channel FET 56 is connected between the first connection 42 and a node B. The substrate contact of the second p-channel FET 56 is also connected to the first connection 42. The channel of the first p-channel FET 50 is connected between the second connection 46 and the gate of the second p-channel FET 56. The node A is connected via the channel of a first n-channel FET 58, the gate of which is also connected to the node A, and in parallel with the former also to ground 44 via the channel of a second n-channel FET 60. The channel of a third p-channel FET 62, the substrate contact of which is connected to the node B, connects the node B to a node C. The node C is connected to ground 44 via the channel of a third n-channel FET 64 and in parallel therewith also via a third capacitor 66. The node A is connected to the gates of the third p-channel FET 62 and of the third n-channel FET 64. The node B is connected to ground 44 via a fourth capacitor 68.

After the power supply for a voltage source (or a voltage generator) for generating a reference voltage which has been connected, the voltage source first generates with the rising supply voltage a voltage which follows the supply voltage. The voltage between the first connection 42 and the second connection 46 is, therefore, initially zero (0), and the second p-channel FET is non-conducting. Since the channels of the first and of the second n-channel FET 58, 60 are first non-conducting, the potential of node A, due to the coupling via the second capacitor 52, follows the potential of the first connection 42. As long as the potential difference of node A with respect to ground 44 is less than the turn-on voltage of the third n-channel FET 64, the channel of the third n-channel FET 64 is non-conducting, and the potential of the node C is kept at the potential of ground 44 due to the originally discharged third capacitor 66.

The first n-channel transistor 58 and the third n-channel transistor 64 are substantially identical and form a current balancing circuit. As the supply voltage VSP rises, the second capacitor 52 initially causes the potential of the node A to follow the potential of the first connection 42 as long as the channels of the n-channel FETs 58, 60, 64 are non-conducting. The second capacitor 52 thus also ensures, in particular, that the gate voltage of the first and of the third n-channel FET 58, 64 reaches its turn-on voltage as soon as the supply voltage reaches the turn-on voltage. When the supply voltage exceeds the turn-on voltage of the first and of the third n-channel FET 58, 64, their channels become conducting. The conducting channel of the third n-channel FET 64 then keeps the potential of the node C at the potential of the ground 44.

As soon as the reference voltage $V_{ref}$ is greater than the turn-on voltage of the p-channel FET 50, on the one hand, and, on the other hand, the difference between the supply voltage VSP and the reference voltage $V_{ref}$ exceeds the turn-on voltage of the second p-channel FET 56, its respective channel becomes conducting and the potential of the node B rises to the potential of the first connection 42. As soon as the voltage between the nodes B and A exceeds the turn-on voltage of the p-channel FET 62 in this arrangement, its channel also becomes conducting and the potential of node C rises. This ensures that the potential of node C only rises above the potential of ground 44 when the supply voltage VSP is greater than the sum of the turn-on voltages of the third n-channel FET 64 and of the third p-channel FET 62. The level of the supply voltage VSP at which the potential of node C begins to rise above the potential of the ground 44 and approximately to rise up to the potential of the first connection 42, as will be described in the text which follows, may be adjusted via the drive strength of the third n-channel FET 64. This switching level of the supply voltage is also dependent on the RC time constant formed from the capacitance of the second capacitor 52 and the resistance value of the first resistor 54.

As soon as the potential of the node C exceeds the turn-on voltage of the second n-channel FET 60, the potential of node A drops, and the gate voltage of the third n-channel FET 64 drops below its turn-on voltage. The channels of the first and of the third n-channel FET 58, 64 become non-conducting. The potential of node C then rises up to the potential of the first connection 42.

The described feedback via the second n-channel FET 60 has the effect that the current path via the second and the third p-channel FET 56, 62 and the third n-channel FET 64 is disconnected. The only current path still existing between the first connection 42 and ground 44 leads via the first resistor 54 and the second n-channel FET 60. The current flowing there can easily be kept very small (for example, <1 µA) by means of a correspondingly large resistance value of the first resistor 54, and can thus meet low-power requirements. The feedback also ensures that the ready signal is generated without spikes or voltage peaks.

The voltage of node C with respect to ground 44 is used as the ready signal for triggering initialization or termination of the resetting of an integrated circuit. As can be seen from the above description, the potential of node C, which can be used as the ready signal, only changes from the potential of the ground 44 to the potential of the first connection 42 (supply voltage with respect to ground 44) when the reference voltage present at the second input 46 is less than the supply voltage present at the first connection 42 by the turn-on voltage of the second p-channel FET 56, and at the same time, the supply voltage is greater than the sum of the turn-on voltages of the third n-channel FET 64 and of the third p-channel FET 62.

As a variant of the circuit shown in FIG. 2, a high-impedance resistance arrangement with a second resistor 70 may be used instead of the second p-channel FET 56. Assuming that the first n-channel FET 58 and the third n-channel FET 64 have the same drive strength, the switching threshold is now the sum of the turn-on voltages of the third p-channel FET 62 and of the third n-channel FET 64 plus the difference, weighted with the ratio of the resistance values of the second resistor 70 and of the first resistor 54, from the supply voltage and the turn-on voltage of the first n-channel FET 58.

After the supply voltage has been switched off, the first resistor 54 discharges the second capacitor 52. With a new connection of the supply voltage, the same defined starting condition (potential of the first connection 42) is thus present.

According to a further variant, a third resistor 72 connected in parallel with the third capacitor 66 takes on the same function with respect to the capacitor 66 which it discharges after the supply voltage has been disconnected. When the supply voltage is connected again, the same defined starting condition (potential of ground 44) is thus also present at the node C.

A comparison of FIGS. 1 and 2 shows that the third p-channel FET 62 or the third n-channel FET 64 in FIG. 2 has the same function as the FET 24 in FIG. 1. The predetermined interval within which the reference voltage has to lie for the ready signal to be generated is here defined relative to the supply voltage. In particular, the upper limit of this interval is less by the turn-on voltage of the second p-channel FET 56 than the supply voltage.

In generalization of the exemplary embodiments described above and their variants, arbitrary switches, which are also provided in the remainder of the integrated circuit, are provided instead of the field-effect transistors 24 of the devices 22. These switches may be controlled by a voltage which depends on the supply voltage or, respectively, is formed from the latter by a circuit arrangement. Each switch switches when the voltage controlling it exceeds a minimum voltage. In the case of switches with a continuous transition between one state with minimum conductivity ("off") and a state with maximum conductivity ("on"), a resistance value defining the boundary between "off" and "on" is specified as the boundary between the switching stages.

While the foregoing is directed to embodiments of the present invention, other and further embodiments of the invention may be devised without departing from the basic scope thereof, and the scope thereof is determined by the claims that follow.

What is claimed is:

1. An integrated circuit, comprising:
an input for receiving a supply voltage;
a voltage source connected to the input to receive the supply voltage and configured for generating a reference voltage on the basis of the supply voltage, wherein the reference voltage is substantially independent of the supply voltage when the supply voltage is above a threshold level;
a first device comprising a switch which switches when a switch voltage dependent on the supply voltage exceeds a minimum voltage; the first device being configured for determining whether the switch has switched;
a second device for detecting the reference voltage generated by the voltage source;
a third device, connected to receive outputs from the first device and the second device, for generating a ready signal indicating that the supply voltage is sufficient for performing functions of the integrated circuit, wherein the ready signal is generated when the first device indicates that the switch has switched and, concurrently, when the second device indicates that the reference voltage lies within a predetermined interval; and
a plurality of different field-effect transistors, each comprising a gate, each gate being connected to the input such that a respective gate voltage is a function of the supply voltage, wherein for each of the plurality of different field effect transistors a respective first device is provided, and each device is configured to determine for the respective field-effect transistor whether its respective gate voltage exceeds its respective turn-on voltage, and wherein the third device is configured to generate the ready signal only when each respective gate voltage at each field-effect transistor exceeds its respective turn-on voltage.

2. The integrated circuit of claim 1, wherein the switch comprises a field-effect transistor having a gate connected to the input such that a gate voltage present at the gate is a function of the supply voltage, wherein the switch voltage is the gate voltage and the minimum voltage is a turn-on voltage of the field-effect transistor, and wherein the first device is configured to determine whether the gate voltage of the field-effect transistor exceeds the turn-on voltage of the field-effect transistor.

3. The integrated circuit of claim 1, further comprising:
a fourth device for resetting the integrated circuit, wherein the fourth device is connected to receive the ready signal from the third device and configured to cancel the resetting of the integrated circuit in response to the received ready signal.

4. The integrated circuit of claim 1, wherein the integrated circuit is configured to perform an initialization routine in response to the ready signal.

5. The integrated circuit of claim 1, wherein the third device is configured to generate the ready signal only when the supply voltage is greater than the reference voltage.

6. An integrated circuit, comprising:
a plurality of sub-circuits, each sub-circuit comprising:
an input for receiving a supply voltage;
a voltage source connected to the input to receive the supply voltage and configured for generating a reference voltage on the basis of the supply voltage;
a first device comprising a switch which switches when a switch voltage dependent on the supply voltage exceeds a minimum voltage; the first device being configured for determining whether the switch has switched;
a second device for detecting the reference voltage generated by the voltage source; and
a third device, connected to receive outputs from the first device and the second device, for generating a ready signal indicating that the supply voltage is sufficient for performing functions of the integrated circuit, wherein the ready signal is generated when the first device indicates that the switch has switched and, concurrently, when the second device indicates that the reference voltage lies within a predetermined interval; and
an AND gate receiving the generated ready signals and for performing a logical AND combination of the generated ready signals.

* * * * *

UNITED STATES PATENT AND TRADEMARK OFFICE
CERTIFICATE OF CORRECTION

| | | |
|---|---|---|
| PATENT NO. | : 7,463,074 B2 | |
| APPLICATION NO. | : 11/032536 | |
| DATED | : December 9, 2008 | |
| INVENTOR(S) | : Manfred Menke | |

It is certified that error appears in the above-identified patent and that said Letters Patent is hereby corrected as shown below:

The title page showing the illustrative figure should be deleted to be replaced with the attached title page.

The drawing sheet, consisting of Figs. 1, 3, 4 should be deleted to be replaced with the drawing sheet, consisting of Figs. 1, 3, 4 as shown on the attached pages.

Col. 7, Lines 16-23, please delete the whole paragraph.

Signed and Sealed this

Seventeenth Day of November, 2009

David J. Kappos
*Director of the United States Patent and Trademark Office*

(12) United States Patent
Menke (10) Patent No.: US 7,463,074 B2
(45) Date of Patent: Dec. 9, 2008

(54) INTEGRATED CIRCUIT AND METHOD FOR GENERATING A READY SIGNAL

(75) Inventor: Manfred Menke, Wolfratshausen (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/032,536

(22) Filed: Jan. 10, 2005

(65) Prior Publication Data

US 2005/0179477 A1  Aug. 18, 2005

(30) Foreign Application Priority Data

Jan. 10, 2004 (DE) ............... 10 2004 001 578

(51) Int. Cl.
*H03L 7/00* (2006.01)

(52) U.S. Cl. .................................. 327/142; 327/143

(58) Field of Classification Search .............. 327/143, 327/142

See application file for complete search history.

(56) References Cited

U.S. PATENT DOCUMENTS

| | | | |
|---|---|---|---|
| 5,612,641 A * | 3/1997 | Sali ........................... 327/143 |
| 6,084,388 A | 7/2000 | Toosky | |
| 6,377,090 B1 | 4/2002 | Bruno | |
| 6,469,552 B2 * | 10/2002 | Ohbayashi et al. ........... 327/143 |
| 6,525,515 B1 | 2/2003 | Ngo et al | |
| 6,590,444 B2 * | 7/2003 | Ikehashi et al. .............. 327/541 |
| 6,683,481 B1 * | 1/2004 | Zhou et al. .................. 327/143 |
| 6,731,143 B2 * | 5/2004 | Kim ........................... 327/143 |
| 6,774,882 B2 * | 8/2004 | Yamazaki et al. ............ 345/98 |
| 2001/0010480 A1 | 8/2001 | Kato et al. | |
| 2004/0217785 A1 * | 11/2004 | Colbeck et al. ............. 327/142 |

OTHER PUBLICATIONS

German Patent Office Examination Report dated Nov. 25, 2004.

* cited by examiner

*Primary Examiner*—Kenneth B. Wells
*Assistant Examiner*—Ryan C Jager
(74) *Attorney, Agent, or Firm*—Patterson & Sheridan, L.L.P.

(57) ABSTRACT

An integrated circuit comprises an input for receiving a supply voltage, a field-effect transistor with a gate which is connected to the input in such a manner that the gate voltage present at the gate is a function of the supply voltage, a voltage source for generating a reference voltage which is connected to the input for receiving the supply voltage, a device for determining whether the gate voltage of the field effect transistor exceeds a turn-on voltage of the field-effect transistor, and a device for generating a ready signal which indicates that the supply voltage is high enough for performing functions of the integrated circuit, the device for generating being constructed for generating the ready signal when the gate voltage of the field-effect transistor exceeds the turn-on voltage of the field-effect transistor. The integrated circuit is characterized by the fact that a device for detecting the reference voltage generated by the voltage source is provided and the device for generating the ready signal is also constructed for generating the ready signal only when the reference voltage lies within a predetermined interval.

6 Claims, 3 Drawing Sheets